United States Patent
Khan (10) Patent No.: US 11,619,675 B2
(45) Date of Patent: Apr. 4, 2023

(54) ON-BOARD CAPACITOR HEALTH MONITORING SYSTEMS AND METHODS

(71) Applicant: GOODRICH CORPORATION, Charlotte, NC (US)

(72) Inventor: Shoyeb Khan, Bengaluru (IN)

(73) Assignee: Goodrich Corporation, Charlotte, NC (US)

( * ) Notice: Subject to any disclaimer, the term of this patent is extended or adjusted under 35 U.S.C. 154(b) by 284 days.

(21) Appl. No.: 17/139,140

(22) Filed: Dec. 31, 2020

(65) Prior Publication Data
US 2021/0231744 A1    Jul. 29, 2021

(30) Foreign Application Priority Data
Jan. 27, 2020   (IN) .............................. 202041003631

(51) Int. Cl.
| | | |
|---|---|---|
| G01R 31/36 | (2020.01) | |
| G01R 31/392 | (2019.01) | |
| G01R 31/367 | (2019.01) | |
| H02M 5/458 | (2006.01) | |

(52) U.S. Cl.
CPC ......... *G01R 31/392* (2019.01); *G01R 31/367* (2019.01); *H02M 5/458* (2013.01)

(58) Field of Classification Search
CPC .............. G01R 31/392; G01R 31/367; H02M 5/458; H02M 1/32
See application file for complete search history.

(56) References Cited

U.S. PATENT DOCUMENTS

| | | | |
|---|---|---|---|
| 8,796,982 B2 | 8/2014 | Li | |
| 2013/0155729 A1* | 6/2013 | Lee | .......................... H02P 23/12 363/37 |
| 2016/0315575 A1 | 10/2016 | Yamamoto et al. | |
| 2017/0336463 A1 | 11/2017 | Makdessi et al. | |
| 2020/0313581 A1* | 10/2020 | Chon | ...................... H02M 1/36 |

FOREIGN PATENT DOCUMENTS

EP    3477314    5/2019

OTHER PUBLICATIONS

European Patent Office, European Search Report dated Jun. 11, 2021 in Application No. 21153045.6.

* cited by examiner

*Primary Examiner* — Adolf D Berhane
*Assistant Examiner* — Afework S Demisse
(74) *Attorney, Agent, or Firm* — Snell & Wilmer L.L.P.

(57) ABSTRACT

A method for monitoring DC link capacitor health includes receiving a plurality of DC link capacitor state variables and determining whether each of the DC link capacitor state variables are less than a threshold value. In response to the DC link capacitor state variable being less than the threshold value, a deviation of each of the DC link capacitor state variables from the threshold value is calculated. The method further includes determining whether each of the deviations of the DC link capacitor state variables occurred within a threshold time. The method further includes calculating a probability of failure of a DC link capacitor. The probability of failure is used to estimate a remaining lifespan of the DC link capacitor.

20 Claims, 3 Drawing Sheets

ON-BOARD CAPACITOR HEALTH MONITORING SYSTEMS AND METHODS

CROSS-REFERENCE TO RELATED APPLICATIONS

This application is a non-provisional of, and claims priority to, and the benefit of India Provisional Application No 202041003631 with DAS Code BA47, entitled "ON-BOARD CAPACITOR HEALTH MONITORING SYSTEMS AND METHODS," filed on Jan. 27, 2020, which is hereby incorporated by reference in its entirety.

FIELD

The present disclosure relates generally to power electronic systems and, more particularly, to systems and methods for diagnosing DC link capacitor health for power electronics.

BACKGROUND

DC link capacitors are a cornerstone in power conversion design for many applications, including three-phase Pulse Width Modulation (PWM) inverters, photovoltaic and wind power inverters, industrial motor drives, vehicle onboard chargers and inverters, medical equipment power supplies, etc. Various demanding applications possess cost, harsh environmental, and stringent reliability constraints. Although circuit designs can use different approaches, the long-standing core of power conversion designs includes DC-Link capacitors. DC-Link capacitors can improve system energy density and resolve the physical challenges of ripples introduced by rapid switching that is inherent to switching power conversions.

Ideally, the input power supplied to a three-phase power distribution system used in a power conversion system would be constant and balanced. However, a variety of power quality disturbances exist today, including harmonic distortion, frequency variation, noise, transient voltage spikes, outages, and voltage surges and sags. Unbalanced voltages typically inject a second harmonic voltage component on to the DC bus voltage that increases electrical stresses on the DC link capacitor, potentially shortening the capacitor lifetime.

SUMMARY

A method for monitoring DC link capacitor health is disclosed, comprising receiving, by a controller, a plurality of first DC link capacitor state variables, determining, by the controller, whether each of the first DC link capacitor state variables is less than a first threshold value, calculating, by the controller, a deviation of each of the first DC link capacitor state variables from the first threshold value, in response to the first DC link capacitor state variable being less than the first threshold value, determining, by the controller, whether each of the deviations of the first DC link capacitor state variables occurred within a first threshold time, and calculating, by the controller, a first probability of failure of the DC link capacitor by dividing a total number of the deviations of the first DC link capacitor state variables that occurred within the first threshold time by a total number of the plurality of first DC link capacitor values.

In various embodiments, the method further comprises receiving, by the controller, a plurality of second DC link capacitor state variables, determining, by the controller, whether each of the second DC link capacitor state variables is less than a second threshold value, calculating, by the controller, a deviation of each of the second DC link capacitor state variables from the second threshold value, in response to the second DC link capacitor state variable being less than the second threshold value, determining, by the controller, whether each of the deviations of the second DC link capacitor state variables occurred within a second threshold time, and calculating, by the controller, a second probability of failure of a DC link capacitor by dividing a total number of the deviations of the second DC link capacitor state variables that occurred within the second threshold time by a total number of the plurality of second DC link capacitor values.

In various embodiments, the method further comprises calculating, by the controller, a final probability of failure by calculating a mean value of the first probability of failure and the second probability of failure.

In various embodiments, the method further comprises estimating, by the controller, a remaining lifespan of the DC link capacitor.

In various embodiments, the plurality of first DC link capacitor state variables includes at least one of an input current, an input voltage, a DC link voltage, an output current, an output voltage, a DC link capacitor current, a DC link capacitor temperature, and a loading power.

In various embodiments, the plurality of second DC link capacitor state variables includes at least one of an input current, an input voltage, a DC link voltage, an output current, an output voltage, a DC link capacitor current, a DC link capacitor temperature, and a loading power.

In various embodiments, the first threshold value is a predetermined value.

In various embodiments, the first threshold time is a predetermined value.

In various embodiments, the total number of the plurality of first DC link capacitor values is equal to a sum of the total number of the deviations of the first DC link capacitor state variables that occurred within the first threshold time and a total number of the deviations of the first DC link capacitor state variables that occurred outside of the first threshold time.

A system for monitoring DC link capacitor health for use with a power conversion system is disclosed, comprising a controller and a tangible, non-transitory memory configured to communicate with the controller, the tangible, non-transitory memory having instructions stored thereon that, in response to execution by the processor, cause the controller to perform operations. The operations comprise receiving, by the controller, a plurality of first DC link capacitor state variables, determining, by the controller, whether each of the first DC link capacitor state variables is less than a first threshold value, calculating, by the controller, a deviation of each of the first DC link capacitor state variables from the first threshold value, in response to the first DC link capacitor state variable being less than the first threshold value, determining, by the controller, whether each of the deviations of the first DC link capacitor state variables occurred within a first threshold time, and calculating, by the controller, a first probability of failure of the DC link capacitor by dividing a total number of the deviations of the first DC link capacitor state variables that occurred within the first threshold time by a total number of the plurality of first DC link capacitor values.

In various embodiments, the instructions cause the controller to perform further operations comprising receiving, by the controller, a plurality of second DC link capacitor state variables, determining, by the controller, whether each of the second DC link capacitor state variables is less than a second threshold value, calculating, by the controller, a deviation of each of the second DC link capacitor state variables from the second threshold value, in response to the second DC link capacitor state variable being less than the second threshold value, determining, by the controller, whether each of the deviations of the second DC link capacitor state variables occurred within a second threshold time, and calculating, by the controller, a second probability of failure of the DC link capacitor by dividing a total number of the deviations of the second DC link capacitor state variables that occurred within the second threshold time by a total number of the plurality of second DC link capacitor values.

In various embodiments, the instructions cause the controller to perform further operations comprising calculating, by the controller, a final probability of failure by calculating a mean value of the first probability and the second probability.

In various embodiments, the instructions cause the controller to perform further operations comprising estimating, by the controller, a remaining lifespan of the DC link capacitor.

In various embodiments, the plurality of first DC link capacitor state variables includes at least one of an input current, an input voltage, a DC link voltage, an output current, an output voltage, a DC link capacitor current, a DC link capacitor temperature, and a loading power.

In various embodiments, the plurality of second DC link capacitor state variables includes at least one of an input current, an input voltage, a DC link voltage, an output current, an output voltage, a DC link capacitor current, a DC link capacitor temperature, and a loading power.

In various embodiments, the first threshold value is a predetermined value.

In various embodiments, the first threshold time is a predetermined value.

In various embodiments, the total number of the plurality of first DC link capacitor values is equal to a sum of the total number of the deviations of the first DC link capacitor state variables that occurred within the first threshold time and a total number of the deviations of the first DC link capacitor state variables that occurred outside of the first threshold time.

A power conversion system is disclosed, comprising a DC link capacitor, a controller configured to monitor a plurality of DC link capacitor state variables, and a tangible, non-transitory memory configured to communicate with the controller, the tangible, non-transitory memory having instructions stored thereon that, in response to execution by the processor, cause the controller to perform operations. The operations comprise receiving, by the controller, a plurality of first DC link capacitor state variables, determining, by the controller, whether each of the first DC link capacitor state variables is less than a first threshold value, calculating, by the controller, a deviation of each of the first DC link capacitor state variables from the first threshold value, in response to the first DC link capacitor state variable being less than the first threshold value, determining, by the controller, whether each of the deviations of the first DC link capacitor state variables occurred within a first threshold time, and calculating, by the controller, a first probability of failure of a DC link capacitor by dividing a total number of the deviations of the first DC link capacitor state variables that occurred within the first threshold time by a total number of the plurality of first DC link capacitor values.

In various embodiments, the instructions cause the controller to perform further operations comprising receiving, by the controller, a plurality of second DC link capacitor state variables, determining, by the controller, whether each of the second DC link capacitor state variables is less than a second threshold value, calculating, by the controller, a deviation of each of the second DC link capacitor state variables from the second threshold value, in response to the second DC link capacitor state variable being less than the second threshold value, determining, by the controller, whether each of the deviations of the second DC link capacitor state variables occurred within a second threshold time and calculating, by the controller, a second probability of failure of a DC link capacitor by dividing a total number of the deviations of the second DC link capacitor state variables that occurred within the second threshold time by a total number of the plurality of second DC link capacitor values.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the following detailed description and claims in connection with the following drawings. While the drawings illustrate various embodiments employing the principles described herein, the drawings do not limit the scope of the claims.

DETAILED DESCRIPTION

The following detailed description of various embodiments herein makes reference to the accompanying drawings, which show various embodiments by way of illustration. While these various embodiments are described in sufficient detail to enable those skilled in the art to practice the disclosure, it should be understood that other embodiments may be realized and that changes may be made without departing from the scope of the disclosure. Thus, the detailed description herein is presented for purposes of illustration only and not of limitation. Furthermore, any reference to singular includes plural embodiments, and any reference to more than one component or step may include a singular embodiment or step. Also, any reference to attached, fixed, connected, or the like may include permanent, removable, temporary, partial, full or any other possible attachment option. Additionally, any reference to without contact (or similar phrases) may also include reduced contact or minimal contact. It should also be understood that unless specifically stated otherwise, references to "a," "an" or "the" may include one or more than one and that reference to an item in the singular may also include the item in the plural. Further, all ranges may include upper and lower values and all ranges and ratio limits disclosed herein may be combined.

An object of the present disclosure provides a method for capacitor health monitoring. Systems and methods of the present disclosure may evaluate DC link capacitor parameters to determine the remaining life of the DC link capacitor before failure. The method comprises analyzing a first set of DC link capacitor state variables to determine a first probability of failure, analyzing at least one more set, such as a second, third, fourth, etc. of DC link capacitor state variables to determine a second, third, fourth, etc. probability of failure, calculating an average of probabilities to determine a final probability of failure of the DC link capacitor, and comparing the final probability with a predetermined curve corresponding to a DC link capacitor lifespan, and determining a remaining lifespan of the DC link capacitor using the curve.

The disclosed algorithm for prognostics and health monitoring can be implemented as on-board monitoring loaded onto existing hardware (e.g. processors) and using existing feedback signals, without adding extra hardware to the existing system. In various embodiments, the disclosed algorithm is implemented solely in software, utilizing existing hardware systems.

Figure 1:
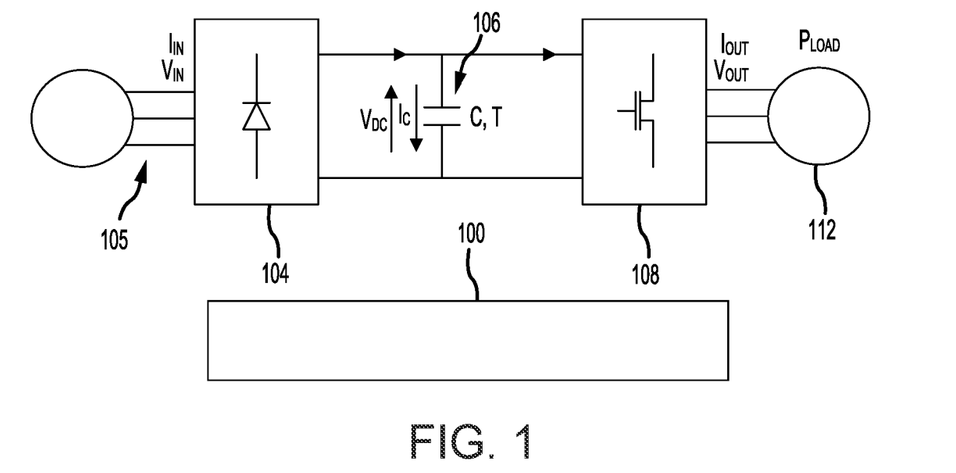
FIG. 1 illustrates a schematic view of a power conversion arrangement having a DC link capacitor health monitoring system, in accordance with various embodiments.

With reference to FIG. 1, an example of an architecture of a DC link capacitor health monitoring system is illustrated that is included in a three-phase inverter having a diode rectifier front end, in accordance with various embodiments. The power converter is mainly composed of a three-phase inverter 108, a DC link capacitor 106, a diode front end rectifier 104, and a controller 100.

In various embodiments, the DC link capacitor 106 comprises a single DC link capacitor. In various embodiments, the DC link capacitor 106 comprises a plurality of capacitors, thus forming a capacitor bank.

During operation, the power converter receives three-phase alternative electric power 105 and drives a load 112. The load 112 may comprise, for example, a three-phase motor.

In various embodiments, the input current ($I_{IN}$), input voltage ($V_{IN}$), DC link voltage ($V_{DC}$), capacitor input current ($I_C$), output current ($I_{OUT}$), output voltage ($V_{OUT}$), loading power ($P_{LOAD}$), and/or DC link capacitor temperature (T) are monitored.

In various embodiments, the controller 100 includes one or more controllers (e.g., processors) and one or more tangible, non-transitory memories capable of implementing digital or programmatic logic. In various embodiments, for example, the one or more controllers are one or more of a general purpose processor, digital signal processor (DSP), application specific integrated circuit (ASIC), field programmable gate array (FPGA), or other programmable logic device, discrete gate, transistor logic, or discrete hardware components, or any various combinations thereof or the like.

Figure 2:
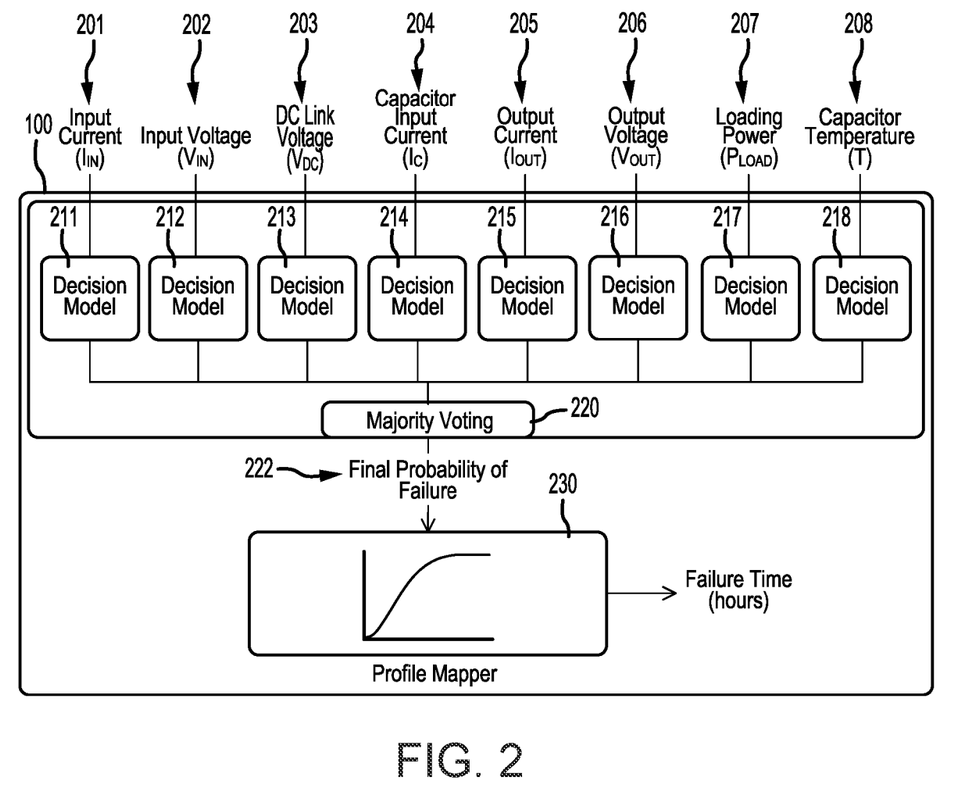
FIG. 2 illustrates a control logic of a DC link capacitor health monitoring system controller, in accordance with various embodiments.

With reference to FIG. 2, a control logic for controller 100 for a DC link capacitor health monitoring system is illustrated, in accordance with various embodiments. System program instructions and/or controller instructions may be loaded onto a non-transitory, tangible computer-readable medium having instructions stored thereon that, in response to execution by a controller, cause the controller to perform various operations. The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media which were found in In Re Nuijten to fall outside the scope of patentable subject matter under 35 U.S.C. § 101.

In various embodiments, controller 100 is an existing controller used for a conversion system, such as the conversion system depicted in FIG. 1 for example. In this regard, system program instructions, as disclosed herein, may be loaded onto an existing controller for a power conversion system, without the need for any additional hardware. In this regard, the methods and control logic disclosed herein may be retrofitted into an existing power conversion system.

In general, controller 100 may receive a plurality of capacitor state variables, calculate a probability of failure of a DC link capacitor for each of the capacitor state variables, determine a final probability of failure based on the plurality of calculated probabilities (e.g., by taking an average value), and then determining a remaining lifespan of the DC link capacitor based on the final probability of failure. Furthermore, a plurality of values may be provided for each capacitor state variable, by which each probability of failure is determined.

In this regard, controller 100 may receive a plurality of capacitor state variables including input current ($I_{IN}$) (also referred to herein as state variable 201), input voltage ($V_{IN}$) (also referred to herein as state variable 202), DC link voltage ($V_{DC}$) (also referred to herein as state variable 203), capacitor input current ($I_C$) (also referred to herein as state variable 204), output current ($I_{OUT}$) (also referred to herein as state variable 205), output voltage ($V_{OUT}$) (also referred to herein as state variable 206), loading power ($P_{LOAD}$) (also referred to herein as state variable 207), and/or DC link capacitor temperature (T) (also referred to herein as state variable 208). A decision model may be implemented for each capacitor state variable for determining a health status using a probability of failure of the DC link capacitor based on each of the capacitor state variables. In this regard, decision model 211 may utilize a plurality of state variables 201 to determine a first probability of failure of the DC link capacitor. Decision model 212 may utilize a plurality of state variables 202 to determine a second probability of failure of the DC link capacitor. Decision model 213 may utilize a plurality of state variables 203 to determine a third probability of failure of the DC link capacitor. Decision model 214 may utilize a plurality of state variables 204 to determine a fourth probability of failure of the DC link. Decision model 215 may utilize a plurality of state variables 205 to determine a fifth probability of failure of the DC link capacitor. Decision model 216 may utilize a plurality of state variables 206 to determine a sixth probability of failure of the DC link capacitor. Decision model 217 may utilize a plurality of state variables 207 to determine a seventh probability of failure of the DC link capacitor. Decision model 218 may utilize a plurality of state variables 208 to determine an eighth probability of failure of the DC link capacitor.

In various embodiments, at node 220, controller 100 may calculate a final probability of failure 222 of the DC link capacitor. In various embodiments, the final probability of failure 222 is calculated by taking the average value of the probability of failures calculated by each of the decision models (e.g., decision model 211 through decision model 218). The final probability of failure 222 may then be used to estimate a remaining lifespan, or a failure time, of the DC link capacitor.

Figure 3:
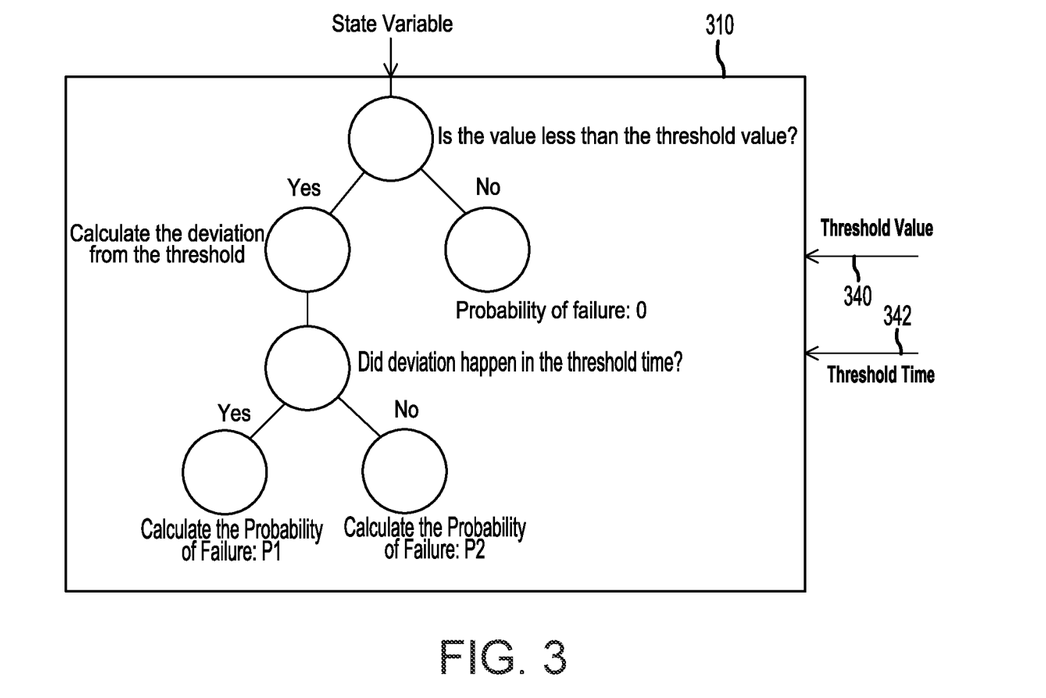
FIG. 3 illustrates a control logic of a decision model, in accordance with various embodiments.

With reference to FIG. 3, a decision model 310 is illustrated, in accordance with various embodiments. Decision model 211, decision model 212, decision model 213, decision model 214, decision model 215, decision model 216, decision model 217, and/or decision model 218 of FIG. 2 may be similar to decision model 310. Decision model 310 may receive a plurality of state variables. Decision model 310 may receive a plurality of first DC link capacitor state variables, such as input current ($I_{IN}$) for example. In various embodiments, the plurality of first DC link capacitor state variables are an array of values as a function of time. Decision model 310 may determine, in turn, whether each of the plurality of first DC link capacitor state variables are less than a threshold value 340. The threshold value 340 is a predetermined value, in accordance with various embodiments. Furthermore, although described herein as determining whether each of the plurality of first DC link capacitor state variables are less than a threshold value, decision model 310 may conversely determine whether each of the plurality of first DC link capacitor state variables are greater than a threshold value without departing from the scope of the present disclosure. For each of the capacitor state variables that are less than the threshold value, the decision model 310 determines a deviation (i.e., difference) of the capacitor state variable from the threshold value 340. The decision model 310 then determines whether this deviation happened with a predetermined threshold time 342. As an example, when analyzing input current ($I_{IN}$), the threshold value may be in units of amperes, such as 10 amperes for example. However, the threshold value may be any value and further may vary depending on the status of operation of the power conversion system. Continuing with the example, if the capacitor state variable is 6 amperes, the threshold value 340 is 10 amperes, and the threshold time 342 is 0.5 seconds, then the decision model 310 may calculate the deviation of the state variable from the threshold value as 4 amperes (10 amperes–6 amperes). The decision model 310 may then determine whether the deviation from 10 amperes occurred within 0.5 seconds. In this example, the decision model 310 may subtract the time (t1) that the state variable was at the threshold value (i.e., 10 amperes) from the time (t2) at which the state variable reached 6 amperes to determine whether this deviation from the threshold value 340 was within the threshold time 342 of 0.5 seconds. In response to this deviation being calculated to have happened within the threshold time 342, then the capacitor state variable counts towards a higher probability of failure (P1). In response to this deviation being calculated to have not happened within the threshold time 342, then the capacitor state variable counts against a higher probability of failure (P2). After all of the plurality of first DC link capacitor state variables have been analyzed, an individual (e.g., a first) probability of failure corresponding to the first DC link capacitor state variable is determined by the following equation:

$$\text{Probability of Failure} = P1/P1 + P2 \qquad \text{Eq. (1)}$$

where P1 is the probability of failure due to the number of deviations of the first DC link capacitor state variables that happened within the threshold time, and P2 is the probability of failure due to the number of deviations of the first DC link capacitor state variables that happened outside of the threshold time.

In various embodiments, the threshold value 340 and threshold time 342 may be predetermined during a training phase of the decision model 310. For example, during the training phase of the decision models, the values of respective parameters can be used to check which threshold values provide the most accurate probability of failure predictions. For example, considering a decision model for input current, during the training phase all the values of the input current and the respective time may be used to check which provides the best threshold for accurately predicting probability of failure. In various embodiments, Gini index (Gi) may be defined:

$$Gi = 1 - \sum_{i=1}^{n} p^2 \qquad \text{Eq. 2}$$

where 'p' is the probability of failure.

Each value in the training dataset (i.e. input current and the corresponding time) may be associated with this Gini Index and the one with the lowest Gini index value may be used as the threshold value and threshold time. In this manner, the most optimal threshold values may be used for determining probability. However, it is contemplated herein that various other methods for determining threshold values may be used without departing from the scope of the present disclosure.

With reference again to FIG. 2, controller 100 may iterate through the logic of decision model 310 (see FIG. 3) for each of the DC link capacitor state variables. After an individual probability of failure is calculated for each of the DC link capacitor state variables, controller 100 may calculate a final probability of failure 222 of the DC link capacitor. The final probability of failure 222 of the DC link capacitor may be calculated by taking an average value of the individual probabilities of failure of the DC link capacitor values. The final probability of failure 222 of the DC link capacitor may then be used to estimate the remaining lifespan, or a failure time, of the DC link capacitor using profile mapper 230. Profile mapper 230 may utilize a predetermined curve, such as the cumulative distribution function of capacitor failure curve represented in FIG. 4 for example, to estimate the remaining lifespan.

Figure 4:
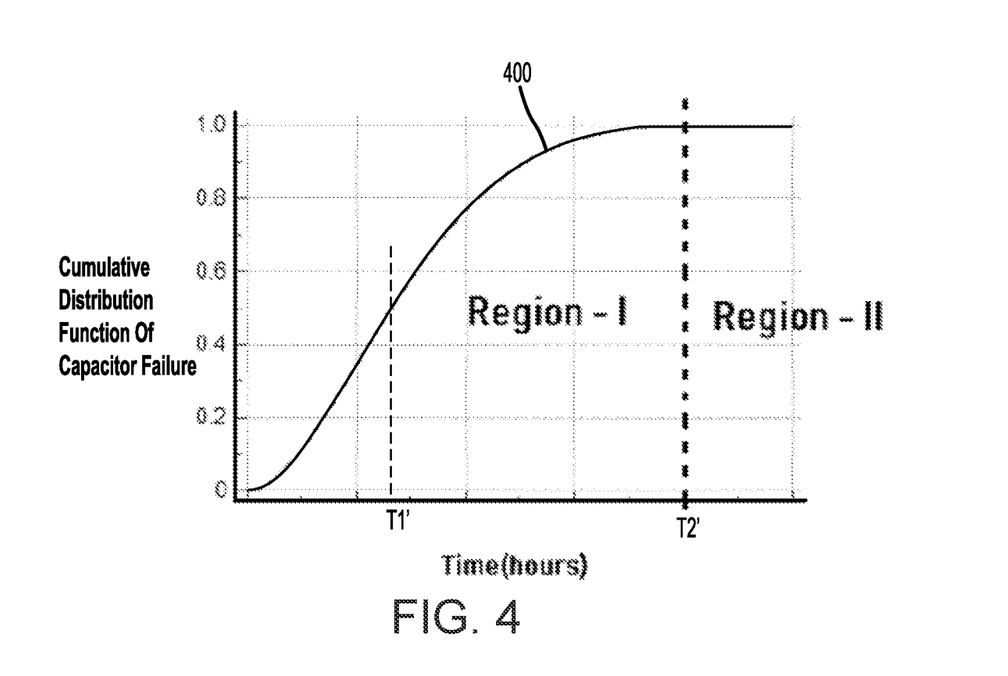
FIG. 4 illustrates a cumulative distribution function of capacitor failure curve, in accordance with various embodiments.

With reference to FIG. 4, a curve 400 representing the cumulative distribution function of capacitor failure versus time is provided. The cumulative distribution function (CDF) may be calculated as:

$$F(t) = 1 - [1 - f(z)]e^{-x^*t} \qquad \text{Eq. 3}$$

where:

$$f(z) = \int_{-\infty}^{z} g(w)dw \qquad \text{Eq. 4}$$

-continued $$g(w) = \frac{e^{-\frac{w^2}{2}}}{\sqrt{(2\pi)}} \quad \text{Eq. 5}$$

$$z = \frac{t-\mu}{\sigma} \quad \text{Eq. 6}$$

where
- t: time (hours)
- μ: mean of the distribution
- σ: standard deviation
- x: failure rate The obtained graph is depicted in FIG. 4. The curve 400 can be represented in matrix form (2D) and may be stored in memory. As illustrated, the maximum value of curve 400 is 1, which represents 100% probability of failure of the DC link capacitor (region II), and the minimum value of curve 400 is 0, which represents 0% probability of failure of the DC link capacitor. If the final probability of failure 222 of the DC link capacitor is less than 100% (e.g., ≤0.99) (region I), then the failure time can be predicted. The remaining lifespan of the DC link capacitor may be determined by fitting the final probability of failure 222 of the DC link capacitor to curve 400, thereby providing an estimated remaining lifespan of the DC link capacitor. For example, if the final probability of failure 222 of the DC link capacitor is 0.5 (T1'), then the estimated remaining lifespan would be calculated as T2'-T1'.

Figure 5:
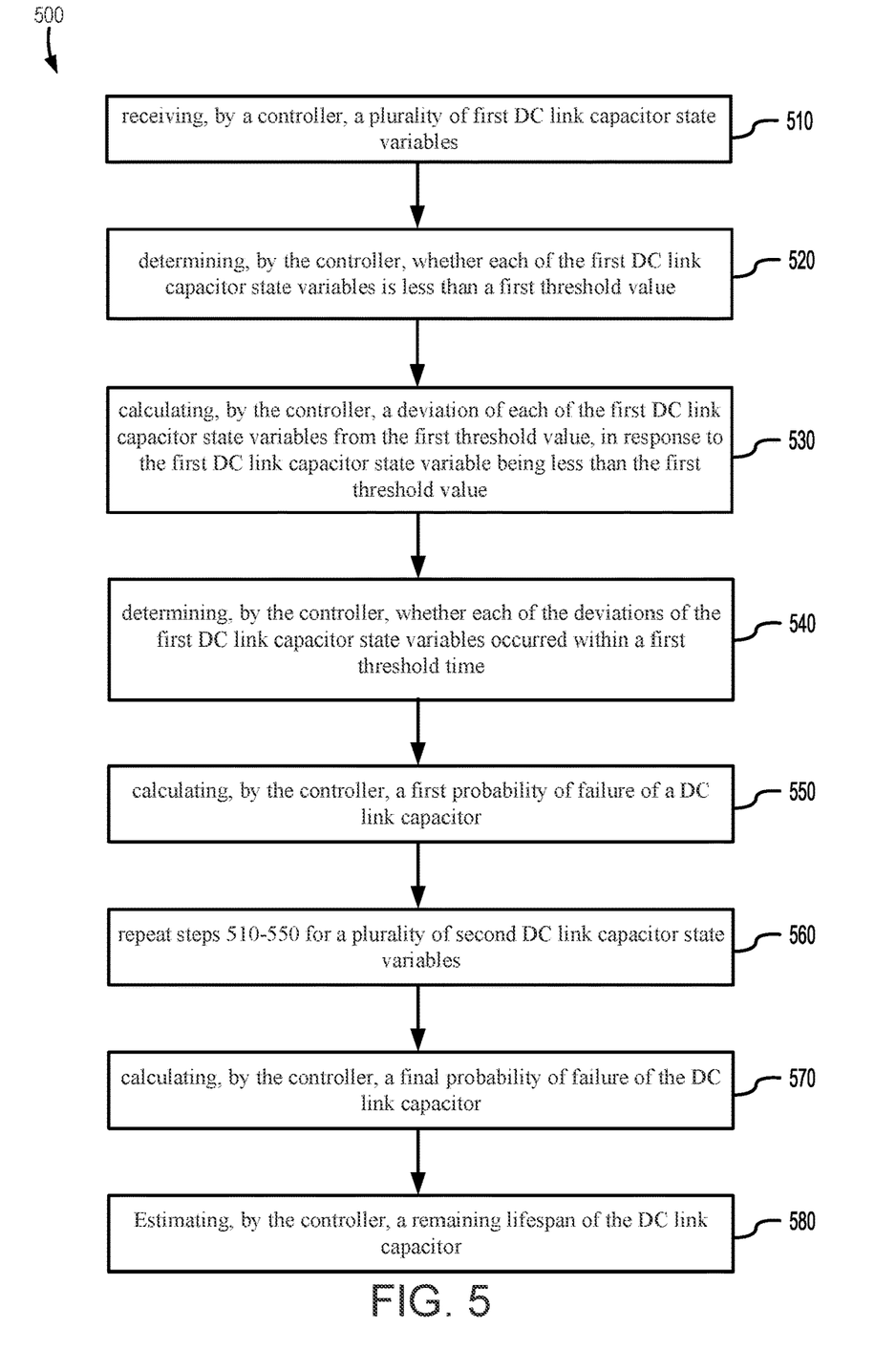
FIG. 5 illustrates a method for monitoring DC link capacitor health, in accordance with various embodiments.

With reference to FIG. 5, a method 500 for monitoring DC link capacitor health is provided, in accordance with various embodiments. Method 500 includes receiving, by a controller, a plurality of first DC link capacitor state variables (step 510). Method 500 includes determining, by the controller, whether each of the first DC link capacitor state variables is less than a first threshold value (step 520). Method 500 includes calculating, by the controller, a deviation of each of the first DC link capacitor state variables from the first threshold value, in response to the first DC link capacitor state variable being less than the first threshold value (step 530). Method 500 includes determining, by the controller, whether each of the deviations of the first DC link capacitor state variables occurred within a first threshold time (step 540). Method 500 includes calculating, by the controller, a first probability of failure of a DC link capacitor by dividing a total number of the deviations of the first DC link capacitor state variables that occurred within the first threshold time by a total number of the plurality of first DC link capacitor values (step 550). Method 500 includes repeating steps 510-550 for a plurality of second DC link capacitor state variables (step 560). Method 500 includes calculating, by the controller, a final probability of failure of the DC link capacitor (step 570). Method 500 includes estimating, by the controller, a remaining lifespan of the DC link capacitor (step 580).

With combined reference to FIG. 2, step 510 may include receiving, by controller 100, a plurality of first DC link capacitor state variables (e.g., one of state variables 201, 202, 203, 204, 205, 206, 207, or 208). The state variables may be received from a sensor, memory, or may be derived from another variable. Step 520 may include determining, by controller 100, whether each of the first DC link capacitor state variables is less than a first threshold value (e.g., threshold value 340 of FIG. 3). Step 530 may include calculating, by controller 100, a deviation of each of the first DC link capacitor state variables from the first threshold value, in response to the first DC link capacitor state variable being less than the first threshold value. Step 540 may include determining, by controller 100, whether each of the deviations of the first DC link capacitor state variables occurred within a first threshold time (e.g., threshold time 342 of FIG. 3). Step 550 may include calculating, by controller 100, a first probability of failure of a DC link capacitor using equation 1 as provided herein. Step 560 may include repeating steps 510 through 550 using a plurality of second DC link capacitor state variables (e.g., one of state variables 201, 202, 203, 204, 205, 206, 207, or 208) that are different from the plurality of first DC link capacitor state variables. For example, step 510 may include receiving a plurality of input current ($I_{IN}$) values and step 560 may include receiving a plurality of input voltage ($V_{IN}$) values. Step 560 may be repeated for a number of times, as desired, until all of the desired variables are analyzed, including DC link voltage ($V_{DC}$), capacitor input current ($I_C$), output current ($I_{OUT}$), output voltage ($V_{OUT}$), loading power ($P_{LOAD}$), and/or DC link capacitor temperature (T). Step 570 may include calculating, by controller 100, final probability of failure 222 of DC link capacitor 106 (see FIG. 1). Step 580 may include estimating, by controller 100, a remaining lifespan of the DC link capacitor using profile mapper 230 as described herein.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is intended to invoke 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for monitoring DC link capacitor health, comprising:
    receiving, by a controller, a plurality of first DC link capacitor state variables;
    determining, by the controller, whether each of the first DC link capacitor state variables is less than a first threshold value;
    calculating, by the controller, a deviation of each of the first DC link capacitor state variables from the first threshold value, in response to the first DC link capacitor state variable being less than the first threshold value;
    determining, by the controller, whether each of the deviations of the first DC link capacitor state variables occurred within a first threshold time; and
    calculating, by the controller, a first probability of failure of the DC link capacitor by dividing a total number of the deviations of the first DC link capacitor state variables that occurred within the first threshold time by a total number of the plurality of first DC link capacitor values.

2. The method of claim 1, further comprising:
    receiving, by the controller, a plurality of second DC link capacitor state variables;
    determining, by the controller, whether each of the second DC link capacitor state variables is less than a second threshold value;
    calculating, by the controller, a deviation of each of the second DC link capacitor state variables from the second threshold value, in response to the second DC link capacitor state variable being less than the second threshold value;
    determining, by the controller, whether each of the deviations of the second DC link capacitor state variables occurred within a second threshold time; and
    calculating, by the controller, a second probability of failure of a DC link capacitor by dividing a total number of the deviations of the second DC link capacitor state variables that occurred within the second threshold time by a total number of the plurality of second DC link capacitor values.

3. The method of claim 2, further comprising calculating, by the controller, a final probability of failure by calculating a mean value of the first probability of failure and the second probability of failure.

4. The method of claim 3, further comprising estimating, by the controller, a remaining lifespan of the DC link capacitor.

5. The method of claim 2, wherein the plurality of second DC link capacitor state variables includes at least one of an input current, an input voltage, a DC link voltage, an output current, an output voltage, a DC link capacitor current, a DC link capacitor temperature, and a loading power.

6. The method of claim 1, wherein the plurality of first DC link capacitor state variables includes at least one of an input current, an input voltage, a DC link voltage, an output current, an output voltage, a DC link capacitor current, a DC link capacitor temperature, and a loading power.

7. The method of claim 1, wherein the first threshold value is a predetermined value.

8. The method of claim 1, wherein the first threshold time is a predetermined value.

9. The method of claim 1, wherein the total number of the plurality of first DC link capacitor values is equal to a sum of the total number of the deviations of the first DC link capacitor state variables that occurred within the first threshold time and a total number of the deviations of the first DC link capacitor state variables that occurred outside of the first threshold time.

10. A system for monitoring DC link capacitor health for use with a power conversion system, comprising:
    a controller; and
    a tangible, non-transitory memory configured to communicate with the controller, the tangible, non-transitory memory having instructions stored thereon that, in response to execution by the processor, cause the controller to perform operations comprising:
    receiving, by the controller, a plurality of first DC link capacitor state variables;
    determining, by the controller, whether each of the first DC link capacitor state variables is less than a first threshold value;
    calculating, by the controller, a deviation of each of the first DC link capacitor state variables from the first threshold value, in response to the first DC link capacitor state variable being less than the first threshold value;
    determining, by the controller, whether each of the deviations of the first DC link capacitor state variables occurred within a first threshold time; and
    calculating, by the controller, a first probability of failure of the DC link capacitor by dividing a total number of the deviations of the first DC link capacitor state variables that occurred within the first threshold time by a total number of the plurality of first DC link capacitor values.

11. The system of claim 10, wherein the instructions cause the controller to perform further operations comprising:
    receiving, by the controller, a plurality of second DC link capacitor state variables;
    determining, by the controller, whether each of the second DC link capacitor state variables is less than a second threshold value;
    calculating, by the controller, a deviation of each of the second DC link capacitor state variables from the second threshold value, in response to the second DC link capacitor state variable being less than the second threshold value;
    determining, by the controller, whether each of the deviations of the second DC link capacitor state variables occurred within a second threshold time; and
    calculating, by the controller, a second probability of failure of the DC link capacitor by dividing a total number of the deviations of the second DC link capacitor state variables that occurred within the second threshold time by a total number of the plurality of second DC link capacitor values.

12. The system of claim 11, wherein the instructions cause the controller to perform further operations comprising calculating, by the controller, a final probability of failure by calculating a mean value of the first probability and the second probability.

13. The system of claim 12, wherein the instructions cause the controller to perform further operations comprising estimating, by the controller, a remaining lifespan of the DC link capacitor.

14. The system of claim 11, wherein the plurality of second DC link capacitor state variables includes at least one of an input current, an input voltage, a DC link voltage, an output current, an output voltage, a DC link capacitor current, a DC link capacitor temperature, and a loading power.

15. The system of claim 10, wherein the plurality of first DC link capacitor state variables includes at least one of an input current, an input voltage, a DC link voltage, an output current, an output voltage, a DC link capacitor current, a DC link capacitor temperature, and a loading power.

16. The system of claim 10, wherein the first threshold value is a predetermined value.

17. The system of claim 10, wherein the first threshold time is a predetermined value.

18. The system of claim 10, wherein the total number of the plurality of first DC link capacitor values is equal to a sum of the total number of the deviations of the first DC link capacitor state variables that occurred within the first threshold time and a total number of the deviations of the first DC link capacitor state variables that occurred outside of the first threshold time.

19. A power conversion system, comprising:
a DC link capacitor;
a controller configured to monitor a plurality of DC link capacitor state variables; and
a tangible, non-transitory memory configured to communicate with the controller, the tangible, non-transitory memory having instructions stored thereon that, in response to execution by the processor, cause the controller to perform operations comprising:
receiving, by the controller, a plurality of first DC link capacitor state variables;
determining, by the controller, whether each of the first DC link capacitor state variables is less than a first threshold value;
calculating, by the controller, a deviation of each of the first DC link capacitor state variables from the first threshold value, in response to the first DC link capacitor state variable being less than the first threshold value;
determining, by the controller, whether each of the deviations of the first DC link capacitor state variables occurred within a first threshold time; and
calculating, by the controller, a first probability of failure of a DC link capacitor by dividing a total number of the deviations of the first DC link capacitor state variables that occurred within the first threshold time by a total number of the plurality of first DC link capacitor values.

20. The power conversion system of claim 19, wherein the instructions cause the controller to perform further operations comprising:
receiving, by the controller, a plurality of second DC link capacitor state variables;
determining, by the controller, whether each of the second DC link capacitor state variables is less than a second threshold value;
calculating, by the controller, a deviation of each of the second DC link capacitor state variables from the second threshold value, in response to the second DC link capacitor state variable being less than the second threshold value;
determining, by the controller, whether each of the deviations of the second DC link capacitor state variables occurred within a second threshold time; and
calculating, by the controller, a second probability of failure of a DC link capacitor by dividing a total number of the deviations of the second DC link capacitor state variables that occurred within the second threshold time by a total number of the plurality of second DC link capacitor values.

* * * * *